United States Patent [19]
Victorin

[11] Patent Number: 5,473,292
[45] Date of Patent: Dec. 5, 1995

[54] METHOD FOR FINE TUNING THE RESONANT FREQUENCY OF A FILTER IN A COMBINER

[75] Inventor: John A. Victorin, Stockholm, Sweden

[73] Assignee: Telefonaktiebolaget LM Ericsson, Stockholm, Sweden

[21] Appl. No.: 191,753

[22] Filed: Feb. 4, 1994

Related U.S. Application Data

[63] Continuation of Ser. No. 809,322, Dec. 18, 1991, abandoned.

[30] Foreign Application Priority Data

Dec. 21, 1990 [SE] Sweden .................... 9004127

[51] Int. Cl.$^6$ ............... H03H 11/04; H03H 11/34; H04J 1/08
[52] U.S. Cl. .................... 333/17.1; 333/174; 455/125
[58] Field of Search ................ 333/17.1, 174; 455/121, 123–125

[56] References Cited

U.S. PATENT DOCUMENTS

| | | | |
|---|---|---|---|
| 3,355,667 | 11/1967 | Bruene | 333/17.1 X |
| 3,715,690 | 2/1973 | Young et al. | 333/17.1 |
| 3,778,731 | 12/1973 | Oomen | 333/17.1 |
| 3,891,926 | 6/1975 | Ishman et al. | 333/17.1 X |
| 4,726,071 | 2/1988 | Jachowski | 455/125 |

FOREIGN PATENT DOCUMENTS 291723  12/1990  Japan .................... 455/123

Primary Examiner—Benny Lee
Attorney, Agent, or Firm—Burns, Doane, Swecker & Mathis

[57] ABSTRACT

The invention relates to a method for fine tuning the resonant frequency of a filter in a combiner, which is provided for combining signals from several radio channels, to the carrier frequency of an input signal to the filter. The power of the output signal from the filter is measured in a narrow frequency band around the carrier frequency of said input signal. Furthermore, the power of the signal reflected by the filter is measured in a narrow frequency band around the carrier frequency of the input signal. Thereafter a measure of the ratio between the two power measurements is formed. The resonant frequency of the filter is adjusted so as to maximize this measure.

10 Claims, 3 Drawing Sheets

METHOD FOR FINE TUNING THE RESONANT FREQUENCY OF A FILTER IN A COMBINER

This application is a continuation of application Ser. No. 07/809,322, filed Dec. 18, 1991, which has been abandoned.

TECHNICAL FIELD

The present invention relates to a method for fine tuning the resonant frequency of a filter in a combiner, which is provided for combining signals from several radio channels, to the carrier frequency of an input signal to said filter. Such combiners are used in for instance mobile radio communication systems.

1. Prior Art

From U.S. Pat. No. 4,726,071 a method for fine tuning the resonant frequency of a filter in a combiner is previously known, according to such a method the power of the signal incident to and reflected by a cavity filter, respectively, is measured and the ratio between these powers is maximized. However, a drawback of this previously known method is that the method is sensitive to signals from neighboring filters, so that an optimum insensitivity to disturbances can not be obtained.

2. Description of the Invention

Thus, an object of the present invention is to provide an improved method for fine tuning the resonant frequency of a filter of a combiner.

According to the invention this is accomplished by (a) measuring the power of the filter output signal in a first narrow frequency band around the carrier frequency of the input signal, (b) measuring the power of the signal reflected by the filter in a second narrow frequency band around the carrier frequency of the input signal, (c) forming a measure of the ratio between the powers measured in step (a) and (b), respectively, and (d) adjusting the resonant frequency of the filter to maximize the measure formed in step (c).

SHORT DESCRIPTION OF THE DRAWING

Further objects and advantages obtained by the invention are best understood by referring to the following specification and the accompanying drawing, in which:

FIG. 1 shows an apparatus for performing the known method of U.S. Pat. No. 4,726,071;

PREFERRED EMBODIMENT

Figure 1:
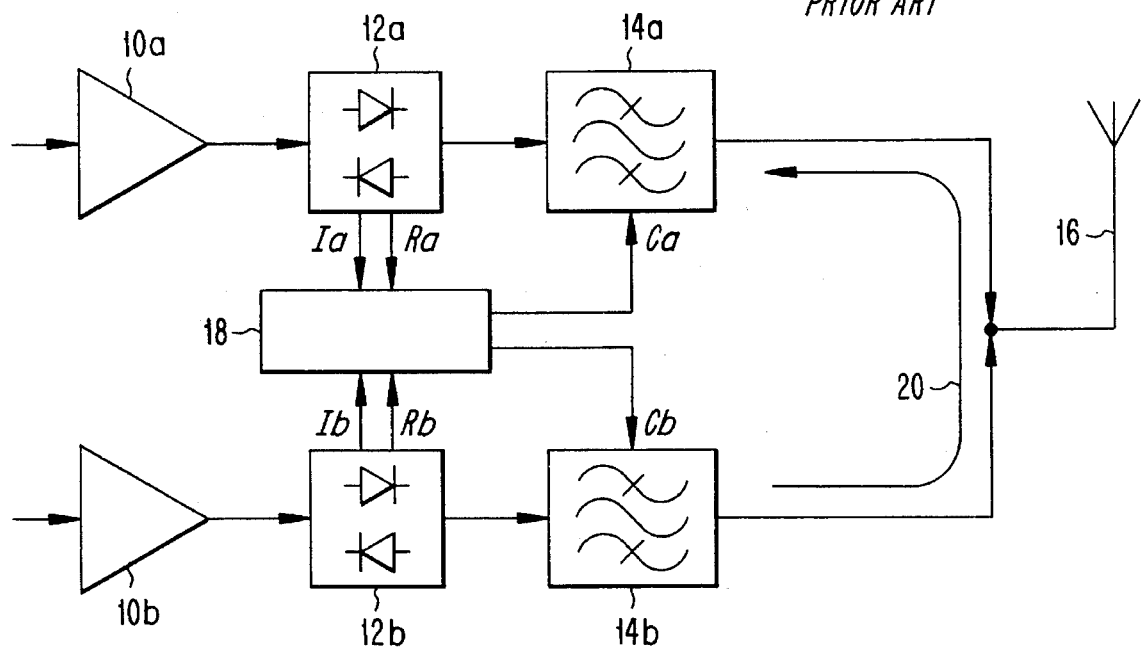

The same reference designations have been used for corresponding elements through out the figures of the drawing.

FIG. 1 shows an apparatus for performing the method previously known from U.S. Pat. No. 4,726,071 for fine tuning the resonant frequency of a filter in a combiner. In the examples shown in FIGS. 1 and 2 the combiner for sake of simplicity comprises only two filters, however, in a practical embodiment such a combiner is mostly provided with several, for instance eight filters. The signals that are to be combined comprise output signals from amplifiers $10a$, $10b$, which over power detectors $12a$, $12b$ are fed to respective band pass filters $14a$, $14b$, usually cavity filters, to be combined and transmitted to the common antenna 16. The powers Ia, Ib of the input signals to filters $14a$, $14b$ and the powers Ra, Rb of the signals reflected by filters $14a$, $14b$ are measured in respective diode detectors in power detectors $12a$, $12b$. Power signals Ia, Ib, Ra, Rb are delivered to a micro computer 18 that computes the ratio Ia/Ra and Ib/Rb, respectively. In accordance with the previously known method micro computer 18 adjusts a resonant frequency adjusting element for respective filter $14a$, $14b$ over control signals Ca, Cb. The adjusting element is adjusted as long as the respective ratio increases. Thereafter the filter is considered to be correctly tuned.

A drawback of the previously known method is that the output signal from one filter, for instance filter $14b$, will influence the result of measurement for the other filter, for instance filter $14a$. The reason for this is that the output signal from filter $14b$ is not only fed to the antenna 16 but also up to and through filter $14a$, as indicated by arrow 20. Since the measurement in detector $12a$ is a wide band detection, the interfering signal 20 from filter $14b$ will also influence the measurements of Ia, Ra for filter $14a$. In unfavorable cases for instance when the output power from amplifier $10a$ is low while the output power from amplifier $10b$ is high, the interfering signal 20 after passage through filter $14a$ can be of the same order of magnitude as the reflected signal Ra.

Figure 2:
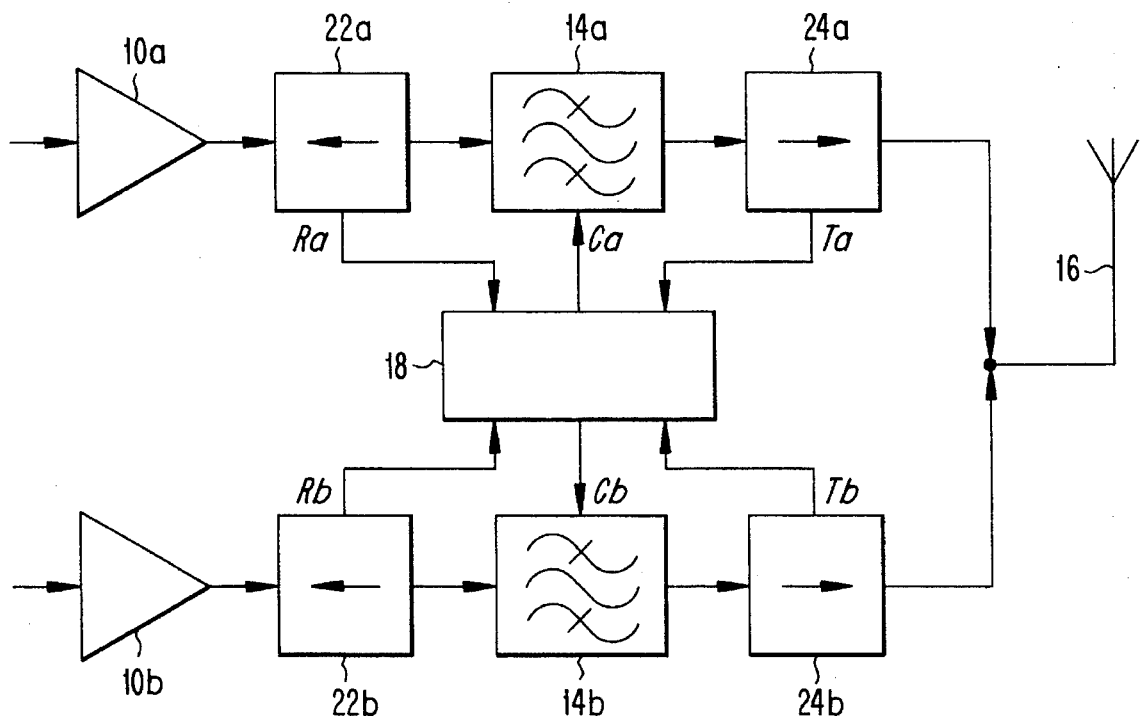
FIG. 2 shows an apparatus for performing the method in accordance with the present invention.

FIG. 2 shows an embodiment of an apparatus for performing the method in accordance with the present invention. As was the case in the apparatus in FIG. 1 signals from amplifiers $10a$, $10b$ are over filter $14a$, $14b$ fed to a common antenna 16. In the method according to the present invention powers Ra, Rb of the reflected signals are detected in detectors $22a$, $22b$. However, the power of the input signals is not measured. Instead the power Ta, Tb of the signals that have passed through the filters is detected in detectors $24a$, $24b$. Another important difference, as compared to the apparatus according to FIG. 1, is that this detection is a narrow band detection around the carrier frequency of the input signal to the respective filter, both during detection of the reflected and transmitted signals. The measured results Ra, Rb and Ta, Tb respectively, are delivered to a micro computer 18, that computes the respective ratios Ta/Ra and Tb/Rb. A resonant frequency adjusting element for the respective filter is adjusted by respective control signals Ca, for maximizing this ratio. When the ratio is maximized the filters are considered to be fine tuned.

Since the power detection is a narrow band detection around the carrier frequency of the signal from amplifier $10a$, the influence of the above mentioned interference signal from the other filter $14b$ is eliminated, since the power of the interference signal is concentrated around the carrier frequency of the signal from the other amplifier $10b$ and therefore lies outside the frequency band that is detected. This leads to an accurately defined maximum for the ratio between the transmitted and reflected signal power.

Figure 3:
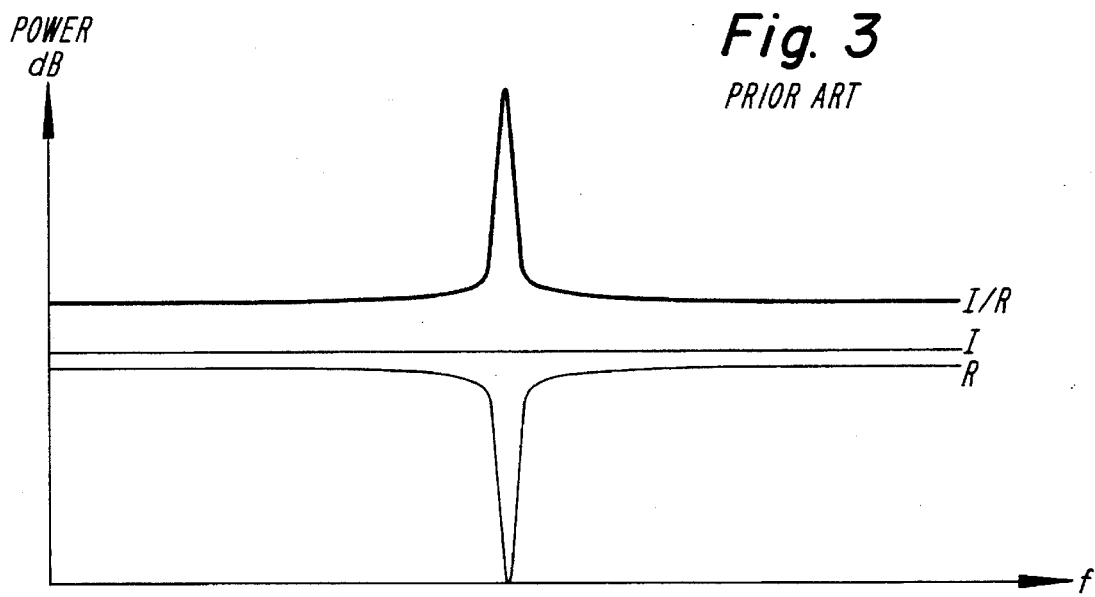
FIG. 3 shows the ratio between the power of the incident and reflected signals for a filter as a function of the resonant frequency of the filter for the previously known method.
Figure 4:
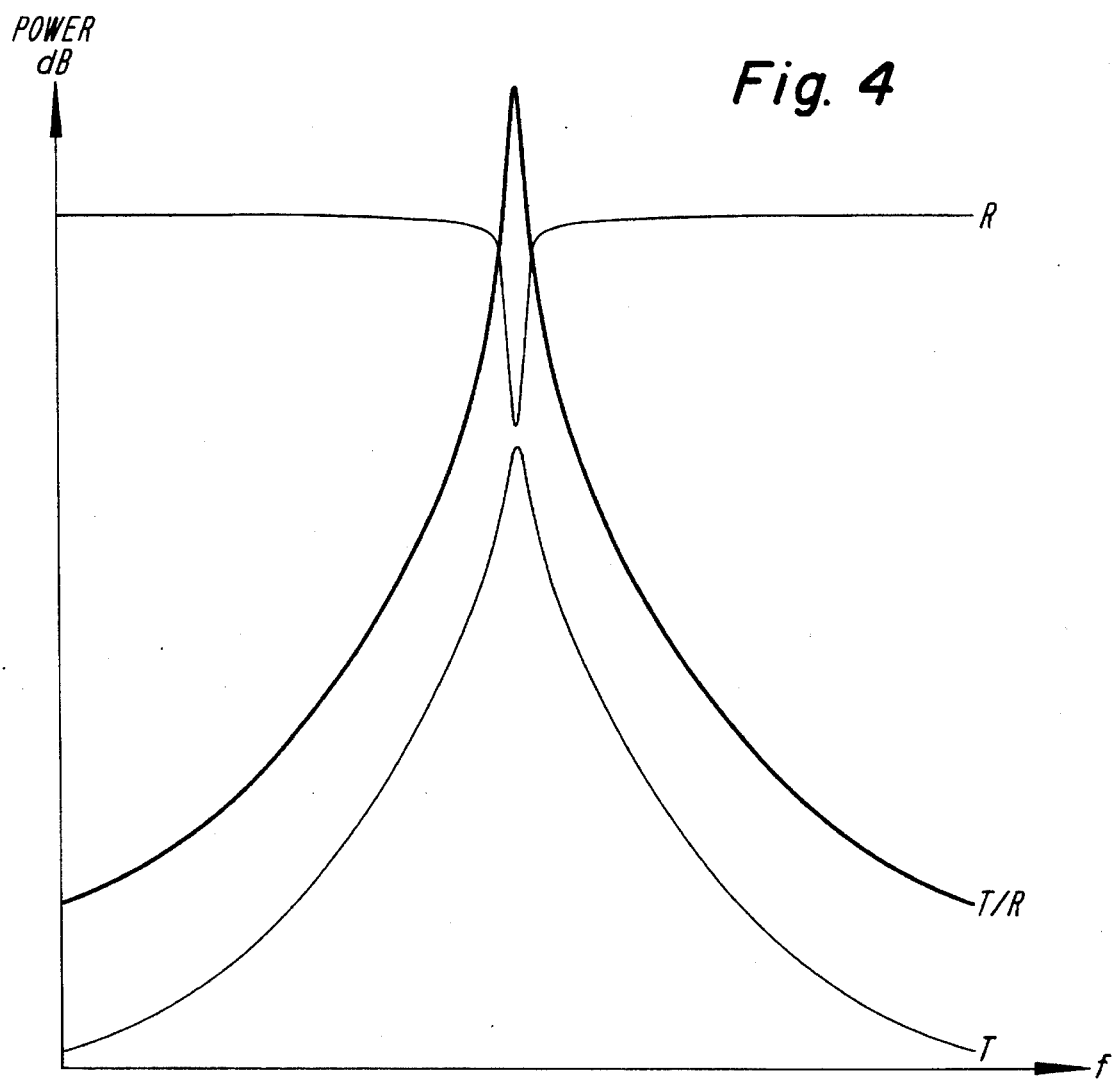
FIG. 4 shows the ratio between the power of the transmitted and reflected signals for a filter as a function of the resonant frequency of the filter for the method in accordance with the present invention.
Figure 5:
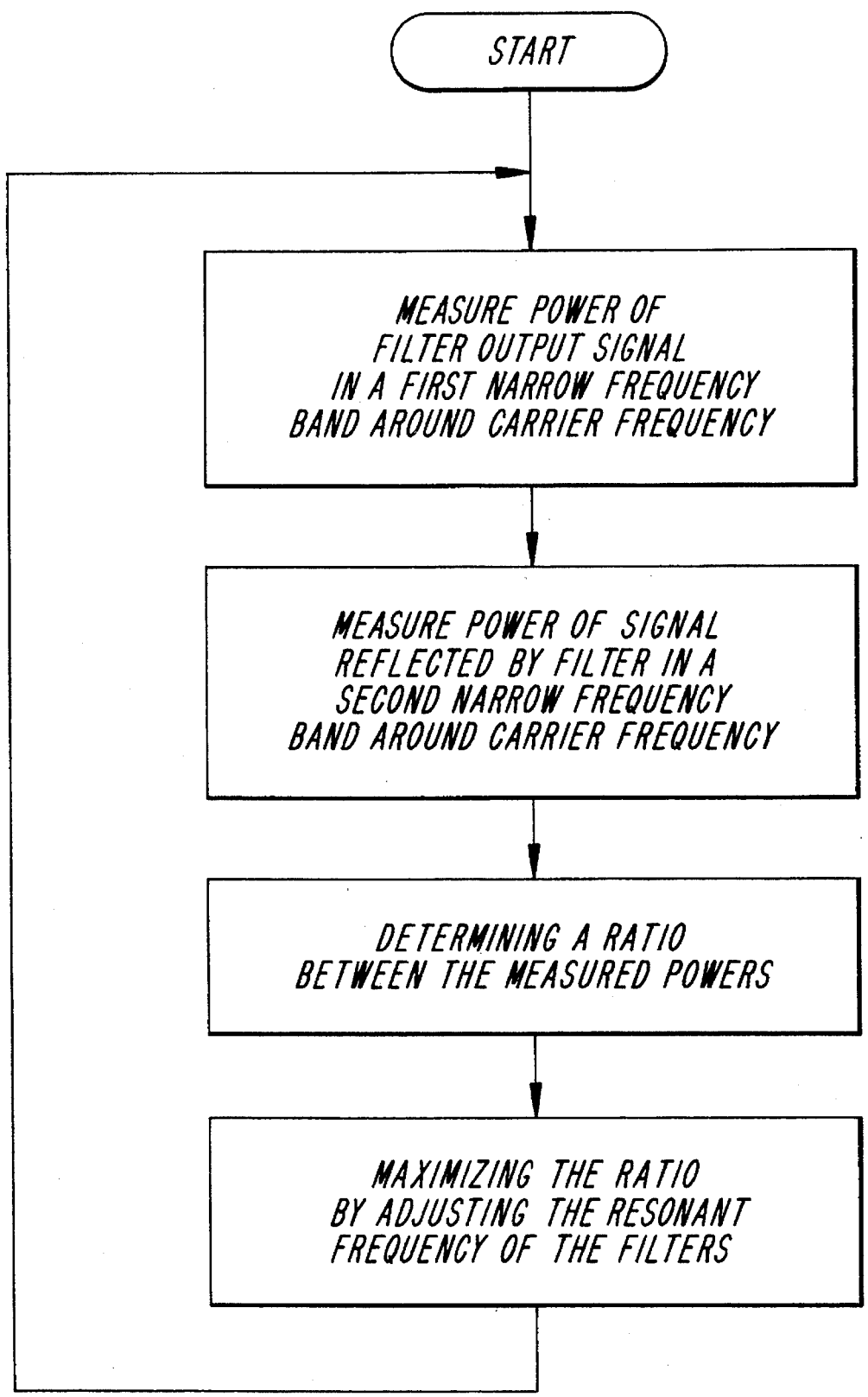
FIG. 5 illustrates a flow diagram of one embodiment of the present invention.

FIGS. 3 and 4 shows qualitative differences between the previously known method and the present invention.

Curve I in FIG. 3 shows the power (in dB) of the signal incident on a filter as a function of the resonant frequency f of the filter. As is apparent in FIG. 3 this curve is constant. Curve R shows the power of the reflected signal as a function of the frequency f. Finally curve I/R is shown, which in the previously known method is used to adjust the filter. As is apparent from FIG. 3 curve I/R is rather constant over the major part of the frequency interval, which is of the order of 10 MHz, and has a narrow peak near the carrier frequency of the incident signal, which in a typical case is of the order of 900 MHz.

Besides the drawback that it is sensitive to disturbances from neighboring channels, the previously known method has the further drawback that a coarse adjustment is hard to perform. Such a coarse adjustment is usually done by stepping frequency f in coarse steps until the ratio I/R exceeds a predetermined value. Thereafter a fine tuning is performed in small steps as long as the ratio increases. Since curve I/R is constant over a major part of the frequency interval and since the peak is narrow, there is a certain risk that the peak will be passed during the coarse adjustment phase.

In FIG. 4 the corresponding curves T, R and T/R for the power of the transmitted signal, the reflected signal and the ratio between these signals, respectively, are shown for the method in accordance with present invention. As is apparent from FIG. 4 the power R of the reflected signal has exactly the same shape as in FIG. 3. However, the power T and the transmitted signal is not constant as is the power I of the incident signal in FIG. 3. The result of this fact is that curve T/R has monotonically increasing flanks and also a narrow peak. Therefore a coarse adjustment based on the principal that T/R shall exceed a minimum value before the fine tuning is started is more reliable in this case. Furthermore, the variation of curve T/R is significantly larger than for curve I/R in FIG. 3. Due to the narrow band detection curve T/R is also to a high degree insensitive to disturbing signals from neighboring channels. Finally, curve T/R is to a high degree independent of the power level of the incident signal.

In a practical embodiment detectors 22a, 22b and 24a, 24b, respectively, comprise logarithmic power detectors that measure the logarithm of the transmitted and reflected power, respectively, in a narrow band around the carrier frequency of the input signal, whereafter the difference between these signals is formed and maximized.

An example of a suitable detector is an oscillator controlled mixer connected to a band pass filter and a power detector. In the mixer the input signal is mixed with a signal with a certain frequency f. The output signal is delivered to the band pass filter that limits the signal to a narrow frequency band around frequency f. Thereafter the output power from the filter is detected in the power detector. As a result of this procedure only the frequencies that have been passed through the band pass filter will contribute to the detected power.

The maximizing can be performed in several different ways.

One example is to measure the power at predetermined points in time and after each measurement adjust the resonant frequency adjusting element of the filter with a predetermined amount as long as the above mentioned ratio increases. The resonant frequency adjusting element can for instance comprise an adjusting capacitor of the type described in Swedish Patent Application 89 04293-1.

Another example is to measure the above mentioned power at predetermined points in time and between the measurement adjust the resonant frequency adjusting element with a predetermined amount. For each measurement the above mentioned ratio is formed. When a predetermined number of measurements have been performed a set of ratios corresponding to different adjustments of the resonant frequency adjusting element has been obtained. Thereafter the resonant frequency adjusting element is adjusted to that adjustment which gave the largest ratio in the set.

The method in accordance with the present invention is useful both for one and two pole filters. However, the method is especially suitable for two pole filters i.e. filters 14a and 14b, since these filters allow small channel separations, which puts high demands on the fine tuning. The features of the two pole filters are well known to those of ordinary skill in the art and will therefore not be repeated herein. The narrow band detection of the transmitted and reflected signal power, respectively, preferably is such that the frequency band used has a width that is less than the radio channel separation in the combiner. An alternative is to use different widths for the frequency band of the transmitted and the reflected signal.

Preferably the frequency band has a width of less than 200 kHz, for instance approximately 150 kHz.

The whole tuning process can be automated. First a coarse tuning can be performed by adjusting the filter resonant frequency in coarse steps until the above ratio exceeds a predetermined minimum value. Thereafter a fine tuning can be performed in small steps according to for instance one of the above described preferred methods.

The skilled artisan appreciates that different changes and modifications of the invention are possible without departure from the scope of the invention, which is defined in the attached patent claims. As has already been indicated above it is for instance not necessary to explicitly form the ratio between the powers of the transmitted and reflected signals, respectively, it is also possible to use a measure of this ratio, for instance the logarithm of said ratio, for the maximizing process.

I claim:

1. A method for fine tuning a respective resonant frequency of at least one of a plurality of filters in a combiner, for combining signals from several radio channels, to match with a respective carrier frequency of a respective input signal applied to at least one of said filters, said method including the steps of:

(a) measuring a power of an output signal of at least one filter in a first narrow frequency band around the carrier frequency of the respective input signal, said first narrow frequency band being narrower than a frequency separation between said carrier frequencies in order to prevent interference from said signals from several radio channels, (b) measuring a power of the signal reflected by at least one filter in a second narrow frequency band around the carrier frequency of the respective input signal, said second narrow frequency band being narrower than the frequency separation between said carrier frequencies, (c) calculating a ratio for each filter between the power measured in step (a) and the power measured in step (b), respectively, and (d) maximizing the ratio formed in step (c) by adjusting the resonant frequency of at least one of said filters.

2. The method of claim 1, including the step of:

calculating a logarithmic ratio in step (c) for each filter between the power measured in step (a) and the power measured in step (b), respectively.

3. The method of claim 1, including the steps of calculating the logarithm of the power obtained in steps (a) and (b), respectively, and calculating said ratio in step (c) by computing the difference between these logarithms.

4. The method of claim 1, including the step of measuring the power in step (a) and (b) at a plurality of predetermined points in time.

5. The method of claim 4, including a step of adjusting a resonant frequency adjusting element for at least one filter after each measurement at each of said predetermined points in time as long as said ratio in step (c) increases.

6. The method of claim 4, including the steps of forming a set of ratios in accordance with step (c) in a predetermined number of measurements at corresponding predetermined points in time for different adjustments of a resonant frequency adjusting element, and thereafter adjusting said element to that frequency which gave the largest ratio in said set.

7. The method of claim 1, wherein in steps (a)–(d) said filter is formed as a two pole filter.

8. The method of claim 7, wherein in steps (a) and (b) said first and second frequency bands have a respective bandwidth that is less than a radio channel separation of said combiner.

9. The method of claim 8, wherein in steps (a) and (b) said first and second frequency band have a respective bandwidth that is less than 200 kHz.

10. The method of claim 9, wherein in steps (a) and (b) said first and second frequency band have a respective bandwidth of approximately 150 kHz.

\* \* \* \* \*